(12) United States Patent
Hoffman (10) Patent No.: US 9,051,177 B2
(45) Date of Patent: Jun. 9, 2015

(54) ACTIVE OPTICAL LIMITING SEMICONDUCTOR DEVICE AND METHOD WITH ACTIVE REGION TRANSPARENT TO LIGHT BECOMING OPAQUE WHEN NOT BIASED

(75) Inventor: Robert C. Hoffman, Woodstock, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 1797 days.

(21) Appl. No.: 12/258,664

(22) Filed: Oct. 27, 2008

(65) Prior Publication Data

US 2010/0102204 A1    Apr. 29, 2010

(51) Int. Cl.
| | | |
|---|---|---|
| *B82Y 20/00* | (2011.01) | |
| *H01J 31/50* | (2006.01) | |
| *G02B 5/20* | (2006.01) | |
| *G02B 27/46* | (2006.01) | |
| *G02F 1/017* | (2006.01) | |
| *G02F 1/15* | (2006.01) | |
| *H01L 27/146* | (2006.01) | |
| *H01L 33/00* | (2010.01) | |

(52) U.S. Cl.
CPC .............. *B82Y 20/00* (2013.01); *G02B 5/207* (2013.01); *G02B 27/46* (2013.01); *G02F 1/017* (2013.01); *G02F 1/1506* (2013.01); *G02F 2201/17* (2013.01); *G02F 2201/38* (2013.01); *G02F 2202/101* (2013.01); *G02F 2202/102* (2013.01); *G02F 2202/108* (2013.01); *G02F 2203/52* (2013.01); *H01J 31/50* (2013.01); *H01L 27/14625* (2013.01); *H01L 33/0004* (2013.01); *H04Q 2213/1301* (2013.01)

(58) Field of Classification Search
USPC ............ 250/208.1, 208.2, 214.1, 214 R, 216; 257/431, 432, 436
See application file for complete search history.

(56) References Cited

U.S. PATENT DOCUMENTS

| | | | |
|---|---|---|---|
| 3,726,585 A * | 4/1973 | Fedotowsky et al. ......... | 359/261 |
| 3,982,979 A | 9/1976 | Hentz et al. | |
| 4,653,879 A | 3/1987 | Filipovich | |
| 5,477,377 A | 12/1995 | Golding et al. | |
| 5,491,579 A | 2/1996 | Justus | |
| 5,737,102 A | 4/1998 | Asher | |
| 6,128,115 A | 10/2000 | Shiragaki | |
| 6,222,203 B1 | 4/2001 | Ishibashi | |
| 6,410,942 B1 | 6/2002 | Thibeault et al. | |
| 6,598,998 B2 | 7/2003 | West et al. | |
| 6,632,684 B2 | 10/2003 | Marsh et al. | |

(Continued)

*Primary Examiner* — Francis M Legasse, Jr.
(74) *Attorney, Agent, or Firm* — Lawrence E. Anderson (57) ABSTRACT

An optical switching system comprising an embodiment with a high pass filter operable to eliminate a portion of frequencies present in an image and an optical device operative to receive the spectrally modified image from the high pass filter, alternatively amplify the spectrally modified image, and propagate at least those frequency components in the spectrally modified image exhibiting a frequency less than an absorption frequency of the optical switching device when the optical switching device is active. Alternatively, the optical switching system may transmit an image only when the system is active. The optical switching system may, for example, comprise superluminescent light emitting diodes which may be, for example, formed in the shape of an inverted truncated prism. For human viewing purposes, the operative transmission ranges may closely coincide with the maximum sensitivity of the photopic response of the corresponding red, blue and green cones in human eyes.

13 Claims, 7 Drawing Sheets

(56) References Cited

U.S. PATENT DOCUMENTS

| | | |
|---|---|---|
| 6,647,168 B2 | 11/2003 | Hsu et al. |
| 6,649,440 B1 | 11/2003 | Krames |
| 6,652,778 B1 | 11/2003 | Twarowski |
| 6,657,236 B1 | 12/2003 | Thibeault et al. |
| 6,821,804 B2 | 11/2004 | Thibeault et al. |
| 6,898,286 B2 | 5/2005 | Murray |
| 6,969,627 B2 | 11/2005 | Pan et al. |
| 6,972,437 B2 | 12/2005 | Kim |
| 7,003,188 B2 | 2/2006 | Hsu et al. |
| 2002/0036828 A1* | 3/2002 | Wong .................. 359/585 |
| 2007/0116423 A1 | 5/2007 | Leatherdale |

* cited by examiner

FIG. 10

ACTIVE OPTICAL LIMITING SEMICONDUCTOR DEVICE AND METHOD WITH ACTIVE REGION TRANSPARENT TO LIGHT BECOMING OPAQUE WHEN NOT BIASED

GOVERNMENT INTEREST

The invention described herein may be manufactured, used, and licensed by or for the United States Government.

TECHNICAL FIELD

The present disclosure generally relates to optical switching devices. An embodiment is directed to an active optical switch using a compound semiconductor for protecting a light-sensitive object from damage due to an incident light beam by limiting the exposure to a predetermined narrow wavelength range with an adaptable exposure time.

BACKGROUND

Optical switching devices may be classified as either passive or active optical switches. Typically, a passive optical switch receives incoming light and changes state based upon the received light; some employing photon absorption for activation and others all-optical components and organic dyes. An example of an optical switch acting as a limiter employing photosensitive compositions is disclosed in U.S. Pat. No. 6,652,778 ('778 patent) to Twarowski. The '778 patent discloses a reversible thermochromic optical switch that incorporates a thermochromic material which is transparent to light at ambient temperature, but turns to a colored state when incident laser radiation causes localized heating, thereby reversibly limiting the transmission of laser radiation. A further example of a passive optical switch acting as a limiter is found in U.S. Pat. No. 5,737,102, to Asher, which disclosed the use of charged particles in a surrounding medium wherein inclusions are added to either the particles or the medium that have a highly nonlinear refractive index. Upon high intensity radiation the refractive index changes. In another embodiment, a nonfluorescent, photoabsorptive dye is incorporated into either or both the particles or medium. Upon being impinged with high intensity radiation, the dye absorbs photons. The drawbacks of passive devices include limited dynamic range and the threshold for operation may be intolerably high, effectively preventing the device from performing its intended function.

In contrast to passive optical switching, active optical switches are activated and/or deactivated by a power signal. An example of active optical switching is found in, for example, U.S. Pat. No. 6,128,115 to Shiragaki, entitled "Optical Switch Device." The '115 patent discloses an optical switching device comprising a plurality of multi-functional wavelength converters in which an input terminal and an output terminal are connected to optical divider and optical coupler wherein a wavelength converter is operative only when a current flows through a semiconductor optical amplifier in the wavelength converter. By turning on/off the current flowing through the semiconductor optical amplifier in the wavelength converter, the wavelength converter functions as a gate switch.

Although optical switches may be employed in telecommunications and fiber optic technologies, active optical switches are not typically employed in the transmission of images in an original, un-encoded state as is readily accomplished with a passive device.

Group III-V semiconductor compounds, such as indium gallium nitride semiconductors, used in connection with light emission devices are well known. For example, in U.S. Pat. No. 6,649,440, to Krames, et al., hereby incorporated by reference as though fully rewritten herein, there is disclosed a light-emitting diode (LED) formed from various Group III-V semiconductor compounds. One embodiment of the LED disclosed in the '440 patent includes a thick multi-layered epitaxial structure comprising an upper and lower AlGaInN region, and an active region therebetween, which may be formed of indium gallium nitride. The '440 patent is directed to increasing the luminous intensity of the emitted light. Heretofore, semiconductor compound devices have not been employed in limiting the intensity of a beam of radiation in connection with the an actively switched optical limiter which absorbs or reduces the intensity of a laser light beam, and which is portable, reliable, and durable

SUMMARY

The present disclosure generally relates to optical switching systems and methods, including applications involving optical switches acting as limiters which may be operator activated for precise exposure intervals to provide a reliable, visual image without prolonged exposure to harmful radiation. A representative embodiment of a system includes a semiconductor light filter for eliminating predetermined wavelengths present when light, such as a laser beam, is being scanned by the operator. This results in what will subsequently be called a "spectrally modified" image. The system may further comprise an actively switched optical imaging device that receives the image from the filter, amplifies the spectrally modified image, and propagates at least those components in the spectrally modified image exhibiting frequencies less than the absorption frequency of the optical switching device when the optical switching device is active.

A representative embodiment of a such method can be broadly summarized by the following steps: eliminating components within an image exhibiting frequencies within a certain frequency range or below a first frequency value; transmitting the spectrally modified image to an optical switching device; amplifying the image via the optical switching device; propagating components present in the image having certain frequencies within the transmission band of the limiting device when the limiting device is active; and transmitting the image to a sensory array or a receiver, which may include a human operator. By controlling the exposure time to certain frequencies of radiation through an operator activated switch, the harmful effects of such radiation may be curtailed or eliminated, depending upon the application and receiver. For example, upon detection of harmful radiation, a viewer or operator may selectively screen the harmful radiation by selectively activating the optical switching device. Alternatively, the operator may limit the radiation exposure to a scanning array by manually or automatically activating the optical switching device to selectively limit the exposure time or the intensity of the light received. In an active system, the exposure time is not limited to the characteristics of the device or inherent operational constraints of the device, as in prior art passive devices, but instead is operator controlled.

Other systems, methods, features, and advantages of the present disclosure will be or may become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

The present disclosure generally relates to optical switching systems and methods. In particular, an optical switch acting as a limiting system in accordance with an embodiment of the present disclosure comprises a high pass optical filter that receives an image and eliminates low-frequency components present in the received image. For such an embodiment, after the image is filtered, the spectrally modified image is focused onto a semiconductor device that may be active or inactive. If the semiconductor device is active, the semiconductor device amplifies and propagates the image. In this regard, the amplified image is preferably transmitted to a sensor array for detection and utilization. When the semiconductor device is deactivated, the image is no longer provided to the sensor array or receiver. In such a construction, the activation or exposure time of the optical limiter is not dependent upon the chemical characteristics or inherent qualities of the components of the device as with passive prior art devices. Instead, the duration of the exposure may be controlled by the operator or may be automatically controlled by a light intensity sensor.

Figure 1:
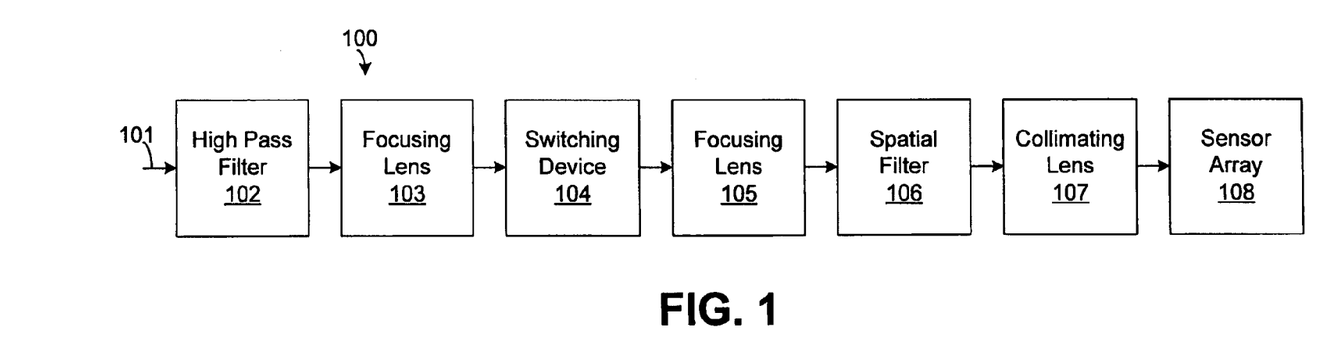
FIG. 1 is a block diagram of an exemplary optical system in accordance with an embodiment of the present disclosure

FIG. 1 depicts an optical system 100 in accordance with an embodiment of the present disclosure. The system 100 comprises a high pass filter 102 that receives an image 101. The high pass filter 102 eliminates components present in the image 101 that fall below a particular frequency, resulting in a spectrally modified image.

The system 100 further comprises a focusing lens 103 and a semiconductor device 104 in accordance with an embodiment of the present disclosure. The focusing lens 103 receives the image 101 from the high pass filter 102, and focuses the image 101 into the semiconductor device 104, which is described further herein with reference to FIGS. 2 and 3.

The semiconductor device 104 propagates the spectrally modified image 101 to a focusing lens 105, if the semiconductor device 104 is active, e.g., power is applied to the semiconductor device 104. In addition to propagating the spectrally modified image 101, the semiconductor device 104 may also amplify the spectrally modified image 101.

The spectrally modified (and alternatively) amplified image 101 is then focused onto a spatial filter 106 via a focusing lens 105. As the spectrally modified image 101 passes to the focusing lens 105 from the semiconductor device 104, the image may contain spatial noise due to spontaneous emission from 104. An optional spatial filter 106 may be utilized; preferably comprising one or more optical components (not shown), e.g., a lens and a pinhole, for removing the undesirable spatial noise from the image 101. The spatial filter may consist of, for example, a circular or rectangular plate with a hole in the center approximately 50 μm in diameter. The hole may be larger or smaller to maximize transmission and to eliminate off axis light rays. Thus, the optional spatial filter 106 is adapted to remove any undesirable optical noise resulting from the semiconductor device 104.

Note that focusing lenses 103 and 105 are also optional and may be any type of lens, series of lenses and/or mirrors known in the art or future-developed for focusing the image 101. In this regard, any type of focusing device may be used to focus the image 101 onto the semiconductor device 104 or onto the spatial filter 106. Further note that the spatial filter 106 may be any type of spatial filter known in the art or future-developed that removes the unwanted spatial noise present in the image 101 due to spontaneous emission in 104, and/or abnormalities in the focusing lenses 103 and 105.

The spatial filter 106 passes the image 101 to an optional collimating lens 107. The collimating lens 107 transforms the image 101 into parallel beams of light. In this regard, the lens 107 collects the light corresponding to the image 101 from the spatial filter 107 and propagates the image 101 to a sensor array 108. Notably, the sensor array 108 is used to detect the image 101 received from the collimating lens. However, it is well known to those of ordinary skill in the art that alternatively other sensing devices or receiving devices may be utilized, including for example, an image receiver or viewer, an opaque screen, or under certain conditions, the image may be viewed by a human in conjunction with or in place of the sensor array.

Figure 2:
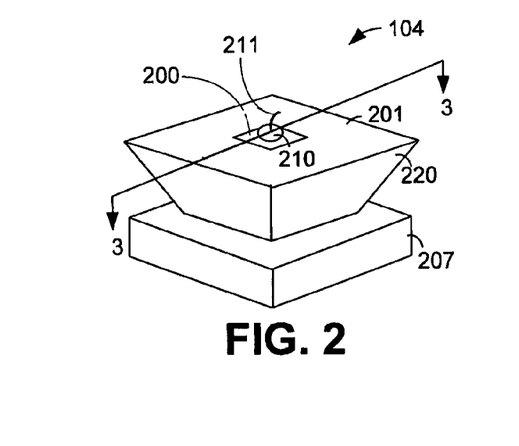
FIG. 2 is a perspective view of an exemplary semiconductor device used in the system of FIG. 1.

FIG. 2 is a perspective view of an exemplary semiconductor device 104. The semiconductor device 104 is preferably fabricated from a compound semiconductor. For example, the compound semiconductor may be a III-V semiconductor compound, e.g., an Aluminum Gallium Arsenide (AlGaAs) semiconductor or an Aluminum Gallium Indium Phosphide (AlGaInP) semiconductor, as described hereinabove. Note that such semiconductors are provided for exemplary purposes only and other types of semiconductors in other embodiments are possible.

The semiconductor device 104 depicted in FIG. 2 is a truncated inverted pyramid (TIP) superluminescent light emitting diode (LED). Generally speaking, a superluminescent diode (SLD) is an edge-emitting semiconductor light source based on superluminescence. In general, superluminescence occurs when the spontaneous emissions of an electroluminescent light emitting diode (ELED) experience gain (amplification) due to higher injected currents and reflections from facets. In general, superluminescent diodes resemble lasers but have no built-in optical feedback mechanism required by laser diodes for stimulated emission to occur in order to achieve lasing. Superluminescent diodes have structural features similar to those of ELEDs that suppress the lasing action by reducing the reflectivity of the facets.

The semiconductor device 104 comprises an electrical contact 200 which may be constructed of approximately 1 μm silver protected with 50 nm aluminum oxide that is surrounded by a single or multilayer anti-reflection coating 201 of a standard antireflection dielectric material such as, but not limited to magnesium fluoride or calcium fluoride. An electrical conductor 211 may be directly affixed to reflector/contact 200 by a solder contact 210. Other forms of electrical transmission could be utilized in the place of electrical conductor 211 as is well known to those of ordinary skill in the art. In order to activate the semiconductor device 104, a user may apply a forward direct current (DC) bias (positive on reflector/contact 200, negative on reflector/contact 206) from electrical conductor 211 to the reflector/contact 200. The semiconductor is situated upon a heat sink 207. This will be subsequently referred to as a "forward bias".

Note that the superluminescent LED may be implemented to receive an image 101 from the high pass filter 102 and propagate the image 101 while amplifying the image as well. Furthermore, the superluminescent LED may switch from active to inactive with a sub-nanosecond response time.

Figure 3:
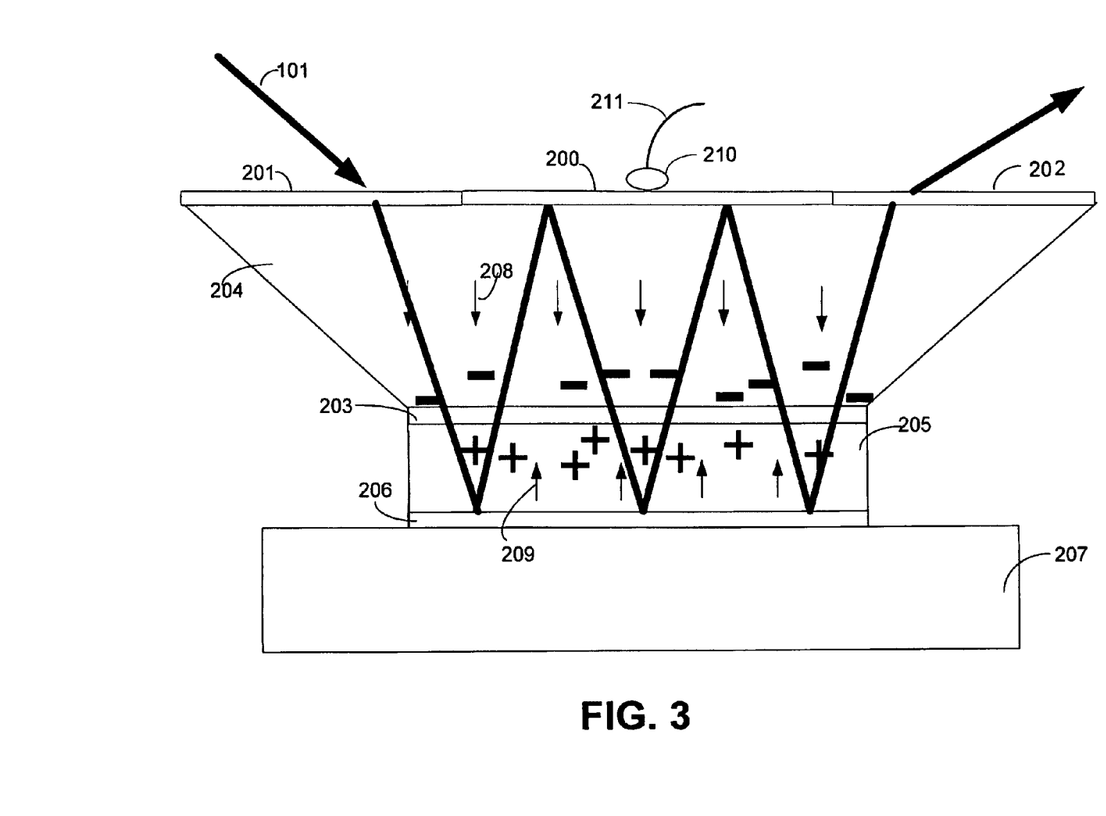
FIG. 3 is a side plan view of the semiconductor device of FIG. 2 in an active state taken along cut line 3-3 of FIG. 2.

FIG. 3 depicts a cross-sectional view of the semiconductor device 104 along cut line 3-3 of FIG. 2 when the semiconductor device 104 is activated. As described hereinabove with reference to FIG. 2, the semiconductor device 104 illustrated in FIG. 3 is a truncated inverted pyramid light emitting diode (LED). However, other types of compound semiconductors in other embodiments are possible.

The semiconductor device 104 is a heterojunction structure comprising an active region 203. By way of background, a heterojunction structure refers to a semiconductor that is fabricated using alternating layers of dissimilar semiconductor material and each alternating material exhibits a different bandgap. A bandgap of a material is the energy difference between the top of the valence band and the bottom of the conduction band of the semiconducting material. This results in efficient confinement and recombination of the electrons and holes in the active region and prevents unwanted recombination outside of the active region. Recombination is the neutralization of a positively charged hole (absence of electron) with an electron, resulting in the emission of a photon (light).

The semiconductor device 104 comprises a p-n junction constructed from an III-V semiconductor. Examples of Group III-V semiconductor compounds include AlGaInN, InP, InAs, GaAs, GaP, InGaAs, and InGaAsP, GaN, and GaInN.

The active region may comprise, for example, a GaInN compound semiconductor, which is direct semiconductor having a sharp absorption edge. The n and p-type regions may be formed from GaN in a manner similar to that disclosed in U.S. Pat. No. 6,649,440, where ohmic contacts forward bias a multilayered Group III-V semiconductor epitaxial LED which causes holes to be injected into the active region from the upper p-type region and electrons to be injected into the active region from the lower n-type region. Within the quantum well(s) of the active region, which may be indium-gallium-nitride, the injected holes and electrons recombine, which results in an excited state.

In the embodiments of FIGS. 1 through 10, in an excited state the active region becomes substantially transparent to the wavelength interval Δλ. It is noted that the wavelength interval of transparency is the same wavelength interval for emission in the excited GaInN semiconductor. When the device is turned "off," emission ceases, and the junction becomes highly absorbing. The "off" switching speed can be in the picosecond range, particularly if the device is heavily biased. The extinction coefficient of the unexcited semiconductor may be approximately $10^6$ m$^{-1}$, depending on the application and materials utilized.

In the embodiments shown in FIGS. 1-10, the active region 203 may consist of a multiple quantum well structure, which is surrounded by two confinement regions 204 (n-type semiconductor such as n-GaN) and 205 (p-type semiconductor such as p-GaN).

The semiconductor device 104 further comprises the reflector/contact 200, described herein with reference to FIG. 2, and reflector/contact 206. In this regard, to activate the semiconductor device 104, a forward bias is applied through the reflector/contacts 200 and 206.

The semiconductor device 104 further comprises the heat sink 207 constructed of a rectangular or circular block of a thermally conductive material such as copper. The heat sink 207 absorbs heat emitted from the semiconductor device 104. The heat sink 207 reduces the risk that the semiconductor device 104 will increase in operating temperature and damage the device 104 or quit operating correctly. In addition, the semiconductor device 104 further comprises the anti-reflection coating 202, through which an image may be outputted in a manner described further herein.

When a forward bias, as previously defined, is applied to the reflector/contacts 200 and 206 electrons flow in the direction indicated by reference arrows 208 into the active region 205. The electrons are negatively charged. Furthermore, holes, i.e., the absence of electrons, are positively charged and flow into the active region 203 in the direction indicated by reference arrows 209. When the forward bias is applied to the reflector/contacts 200 and 206, population inversion occurs in the semiconductor device 104. "Population inversion" refers to the state of the semiconductor device 104 wherein there are, at a given time a non-equilibrium concentration of electron-hole pairs in the active region 203. In this state, the Bernard-Duraffourg inversion condition is satisfied, e.g. $E_{fc} - E_{fv} > h\nu$, where $E_{fc}$ and $E_{fv}$ are the quasi-Fermi levels of the conduction and valence bands and hν is the photon energy, respectively. Thus, the device 104 may amplify the image 101 that is transmitted through the active region 203 of the semiconductor device 104. If minimal feedback is provided, the device will operate in the superluminescent LED regime and the bandwidth will be on the order of kT, where k is Boltzmann's constant and T is the ambient device temperature. Thus, as an example, at 300° K the semiconductor device 104 may exhibit a bandwidth of approximately 3.6 nanometers (nm). This bandwidth will increase as more holes and electrons are injected into the device.

The device may be shut off by a high-speed photodetector (not shown), whereby the carriers are swept out of the active region very rapidly by the high residual field from the forward bias in less than a nanosecond. The active region becomes opaque to the wavelength interval Δλ, exhibiting an extinction coefficient of up to approximately $10^6$ m$^{-1}$. Approximately twelve passes through the unexcited active region may be required to limit an incoming laser pulse. The attenuation through the unexcited junction is described in the equation:

$$I/Io = \exp(-\alpha x L);$$

where I equals the image intensity after passing through the unexcited active layer, Io is the initial image intensity; α is the absorption coefficient of the unexcited active layer (~$10^6$ $m^{-1}$); and L is the thickness of the active region (~$0.75\times10^{-6}$ m); and x is the number of passes through the active layer. For optimal results, the entire device must be placed within an optical system that permits rejection of the spontaneous emission from the TIP-LED limiting device from the desired image.

During operation, in the embodiment of FIG. 1, the image 101 passes through the high pass optical filter 102 described hereinabove. In this regard, the high pass optical filter 102 allows only those optical frequency components within the image 101 above a particular frequency to propagate to the semiconductor device 104. Furthermore, the semiconductor device 104, through band-to-band absorption, allows only those optical frequency components within the image 101 below a particular frequency to be transmitted to the focusing lens 105 (FIG. 1). Thus, the system 100 (FIG. 1) limits transmission of frequencies within the image 101 that fall within a particular frequency band (hereinafter "$\Delta v$") or wavelength $\Delta \lambda$, in a manner described further herein.

The focusing lens 103 focuses the image 101 onto the anti-reflection coating 201 of the semiconductor device 104. When the device 104 is active, i.e., a forward bias, as previously described, is applied to the reflector/contacts 200 and 206, the population inversion in the active region 203 renders the device transparent to the desired $\Delta v$ (or $\Delta \lambda$). The image 101 travels through the active layer 203 of the semiconductor device 204 a plurality of times as it reflects off the reflective reflector regions 201, 200 and 206, which may be, for example, silver or any suitable heavily metal (e.g. Ag, Au, Mg) doped conductive layer which reflects light within the applicable wavelength range. As the image 101 passes through the active region 203, the image 101 may further be amplified by the population inversion that exists in the semiconductor device 104. The unattenuated spectrally modified image 101 exits the device 104 via the anti-reflection coating 202 and continues through the system 100 as described with reference to FIG. 1.

Figure 4:
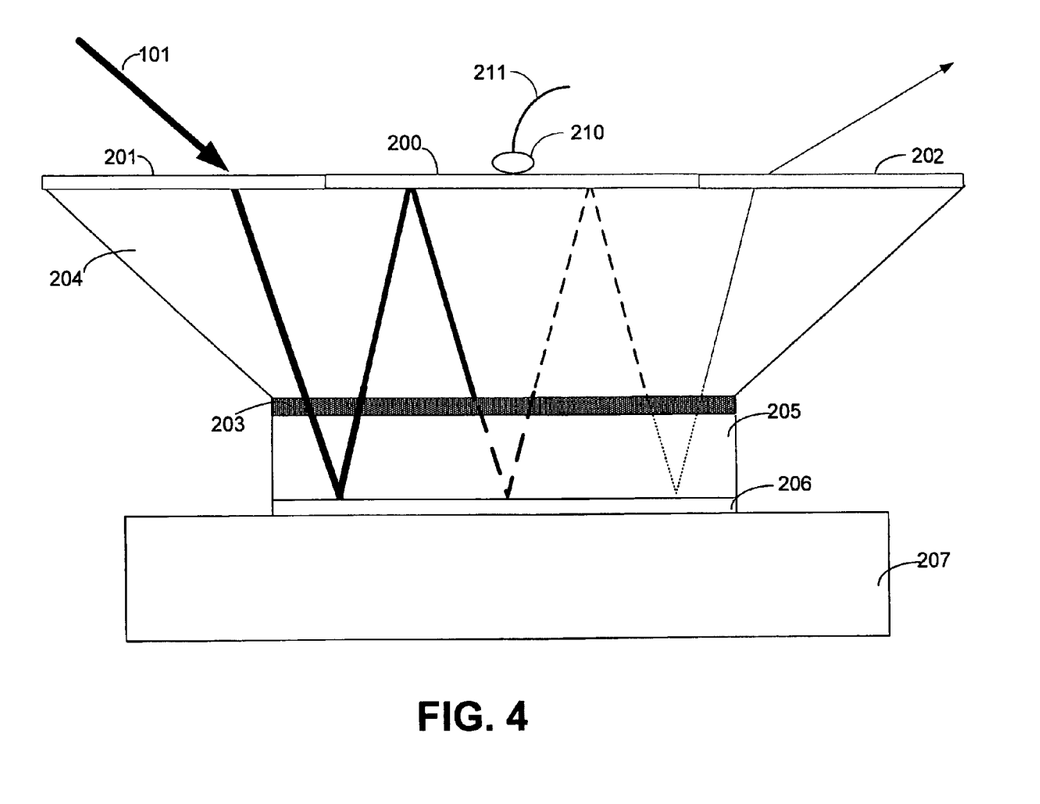
FIG. 4 is a side plan view of the semiconductor device of FIG. 2 in an inactive state taken along cut line 3-3 of FIG. 2.

FIG. 4 a cross-sectional view of the semiconductor device 204 along cut line 3-3 in FIG. 2 when the forward bias is no longer applied to the reflector/contacts 200 and 206, i.e., when the device 204 is inactive. In this regard, when the semiconductor device 104 is shut off, the electrons quickly move from the active region 203 by a high residual field (not shown) from the forward bias described hereinabove. For example, the carriers (electrons and holes) may be moved out of the active region 203 in less than one nanosecond (ns). Therefore, the semiconductor device 204 may exhibit a rapid limiting time, i.e., from active to inactive, when the forward bias is not longer applied to the contacts 200 and 206.

When the electrons and holes are no longer moving to the active region 203, the active region 203 is now opaque to the frequency interval, i.e., it becomes an inactive region. The device 204 may exhibit an extinction coefficient, for example, of $10^6 \, m^{-1}$. In this regard, the "extinction coefficient" refers to the depletion of irradiance or fluence per unit length.

Notably, as the spectrally modified image 101 continues to propagate through the device 204, the image 101 reflects off the reflective reflector/contacts 200 and 206, which may be a coating or layer of silver or a conducting, reflecting material. As the image 101 passes through the region 203, which is now opaque to the frequencies received in the image 101, the intensity of the spectrally modified image 101 diminishes with each pass. In this regard, as the spectrally modified image 101 passes through the region 203, the spectrally modified image attenuates such that the spectrally modified image 101 does not exit via the anti-reflection coating 202.

Figure 5:
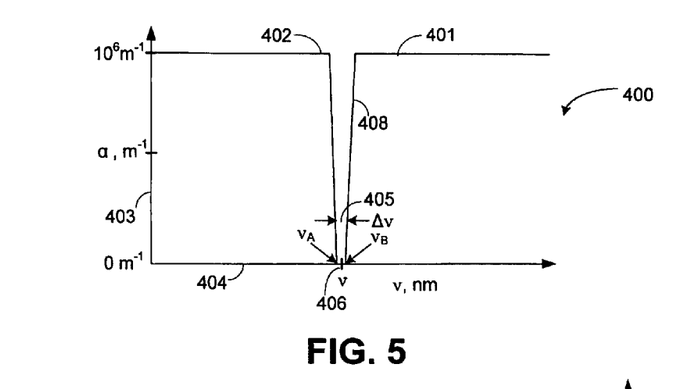
FIG. 5 is a graph depicting the behavior of the system depicted in FIG. 1 when the semiconductor device is active.

FIG. 5 is a graph 400 depicting the transmission profile of the system 100 (FIG. 1) when the semiconductor device 104 is active, e.g., a forward bias is applied to contacts 200 and 206. In this regard, plot 402 depicts the transmission profile of the high pass filter 102 (FIG. 1). The vertical axis 403 shows the attenuation factor $\alpha$; the horizontal axis 404 shows the frequency v. When energized, the device exhibits a frequency bandpass $\Delta v$ 405 at a center frequency v 406. As indicated by the plot 402, the high pass filter 102 blocks any part of the spectrally modified image 101 (FIG. 1) exhibiting a frequency that is less than $v_A$.

Furthermore, the plot 401 depicts the frequency transmission response of the semiconductor device 104 (FIG. 1). In this regard, the semiconductor device 104 (or 204 as shown in FIGS. 3 and 4) exhibits sharp absorption edges 401. Thus, the semiconductor device 104 does not pass any components of the spectrally modified image 101 having frequencies that are greater than $v_B$.

Thus, when the semiconductor device 104 is in the active state, the system 100 exhibits a bandwidth $\Delta v$ that is centered about the frequency v. In this regard, the system 100 allows through those frequency components of the spectrally modified image 100 (FIG. 1) that exhibit a frequency within the range of $v_A$ to $v_B$ to propagate.

Figure 6:
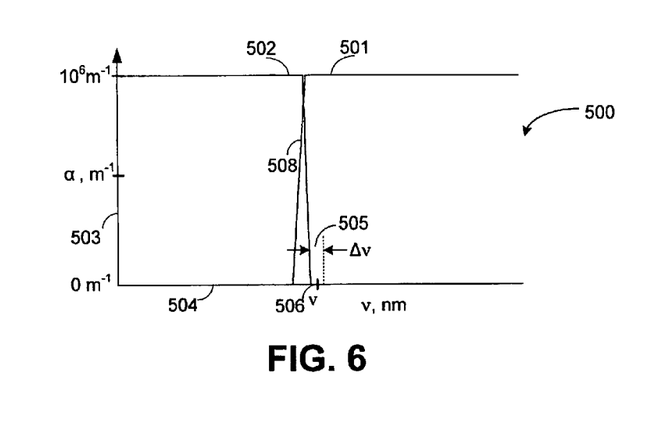
FIG. 6 is a graph depicting the behavior of the system depicted in FIG. 1 when the semiconductor device is inactive.

FIG. 6 is a graph 500 depicting the system 100 in an inactive state, i.e., a forward bias is no longer applied to the contacts 200 and 206 of the semiconductor device 104. As described hereinabove, plot 502 depicts the transmission profile of the high pass filter 102 (FIG. 1). As in the previous figure the vertical axis 503 shows the attenuation factor $\alpha$; the horizontal axis 504 shows the frequency v. When de-energized, the device exhibits a frequency cutoff of bandpass $\Delta v$ 505 centered at frequency v 506. As indicated by the plot 502, like plot 402 (FIG. 5), the high pass filter 102 blocks any component present in the spectrally modified image 101 (FIG. 1) exhibiting a frequency that is less than $v_A$, much like as described with reference to FIG. 5.

However, when a forward bias is no longer applied to the reflector/contacts 200 and 206 of the semiconductor device 104, the semiconductor device 104 exhibits a frequency transmission response as indicated by plot 501. In this regard, when the forward bias is not applied to the semiconductor device 104, the active region 203 (FIG. 3) becomes highly absorbing, changing the absorption edge from the 401 (FIG. 5) to 501, as depicted in FIG. 6. Thus, any components in the spectrally modified image 101 having frequencies within the $\Delta v$ interval centered on v will be blocked. As noted hereinabove, the extinction coefficient of the inactive semiconductor device 104 is approximately $10^6 \, m^{-1}$.

Figure 7:
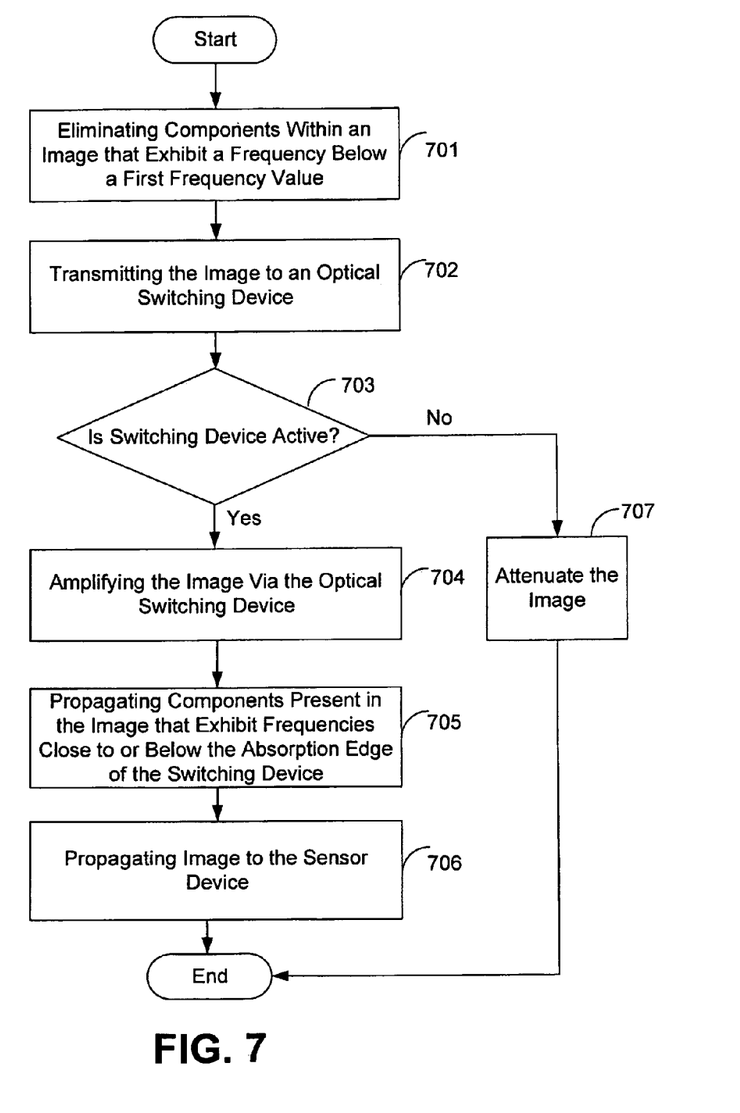
FIG. 7 is flowchart illustrating an exemplary architecture and functionality of the limiting system depicted in FIG. 1.

FIG. 7 is a flowchart illustrating an exemplary method of the system 100 (FIG. 1). In step 701, the system 100 eliminates frequency components within a received image 101 that exhibit a frequency below a first frequency value. In this regard, the system 100 employs a high pass filter having a cutoff point at the frequency below which components are undesired.

The system 100 transmits the spectrally modified image 101 to an optical semiconductor device 104 (FIG. 1), e.g., a compound semiconductor device, in step 702. The system 100 may focus the spectrally modified image 101 onto the semiconductor device 104 via a focusing lens 103 (FIG. 1).

If the semiconductor device 104 is active in step 703, the system 100 amplifies the spectrally modified image via the semiconductor device in step 704. The system 100 propagates those frequency components present in the image that exhibit frequencies below an absorption edge of the semiconductor device in step 705 and transmit the spectrally modified image 101 to a sensor array in step 706. If the semiconductor device 104 is not active in step 703, the semiconductor device 104 attenuates the spectrally modified image in step 707, and the spectrally modified image is not propagated to the sensor array.

Figure 8:
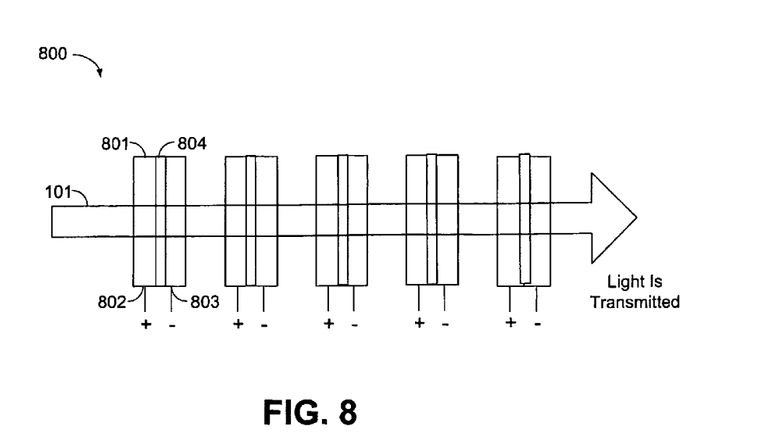
FIG. 8 is an exemplary optical limiting system in accordance with an embodiment of the present disclosure when the optical limiting system is activated.

FIG. 8 illustrates an exemplary system 800 in accordance with an embodiment of the present disclosure. It is a schematic depiction of the cascading process taking place inside the activated device as shown in FIG. 2, with activated device cross section as shown in FIG. 2. An alternative embodiment may actually consist of discrete and separate cascaded devices as depicted in FIG. 8. In such a system 800, an image 101 is received from a high pass filter 102 (FIG. 1), as described hereinabove with reference to FIG. 1. However, the system 800 of FIG. 8 comprises a plurality of superluminescent LEDs 801 arranged in series. Likewise, the LEDs could be arranged in parallel with various frequencies being attenuated. Each of the LEDs 801 comprise regions 802 and 803 through which a forward bias may be applied, as previously discussed, in order to excite an active region 804 of each of the LEDs 801.

The image 101 is then propagated through each of the LEDs 801 and corresponding active regions 804. As the image 101 is propagated through each LED 801, the image 101 may be amplified by population inversion. Further, frequencies present in the image 101 that are below the LEDs' absorption edges are propagated while any other frequencies present in the spectrally modified image are absorbed by the LEDs 801. Notably, the spectrally modified image 101 leaves the array of LEDs 801 amplified and filtered.

Figure 9:
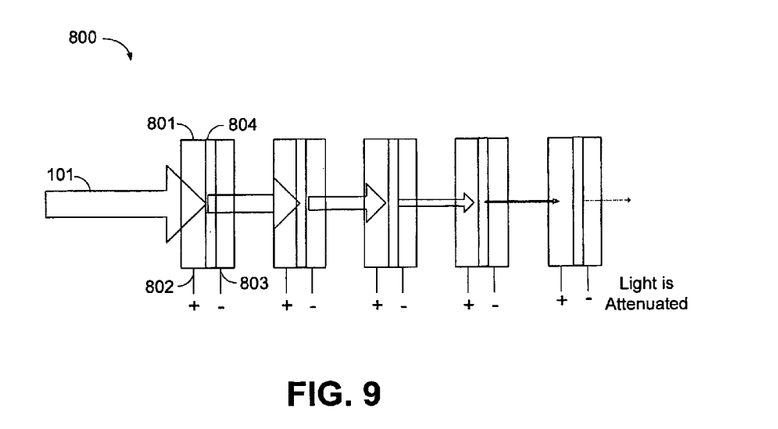
FIG. 9 is an exemplary optical limiting system of FIG. 8 when the optical limiting system is deactivated.

FIG. 9 illustrates the system 800 (FIG. 8) when the LEDs 801 are deactivated, i.e., a forward bias is no longer applied to the regions 802 and 803. Again, it is a schematic depiction of the cascading process taking place inside the de-activated device as shown in FIG. 3, with de-activated device cross section as shown in FIG. 3. As described hereinabove with reference to FIGS. 4 and 6, when the LEDs are deactivated, each active region 804 of the LEDs 801 becomes opaque to the frequencies present in the spectrally modified image 101. Notably, depending upon the strength of the image 101 that is propagating through the system 800, extinction of the spectrally modified image 101 may require any number of LEDs 801. However, for exemplary purposes, five LEDs 801 are illustrated.

As the image 101 propagates through each active region 804 of each LED 801, the image 101 attenuates. Thus, after passing through each of the LEDs 801, the image 101 is extinct. Notably, switching from the excited active region 804 to the unexcited active region 804 may occur on a sub-nanosecond time scale.

Figure 10:
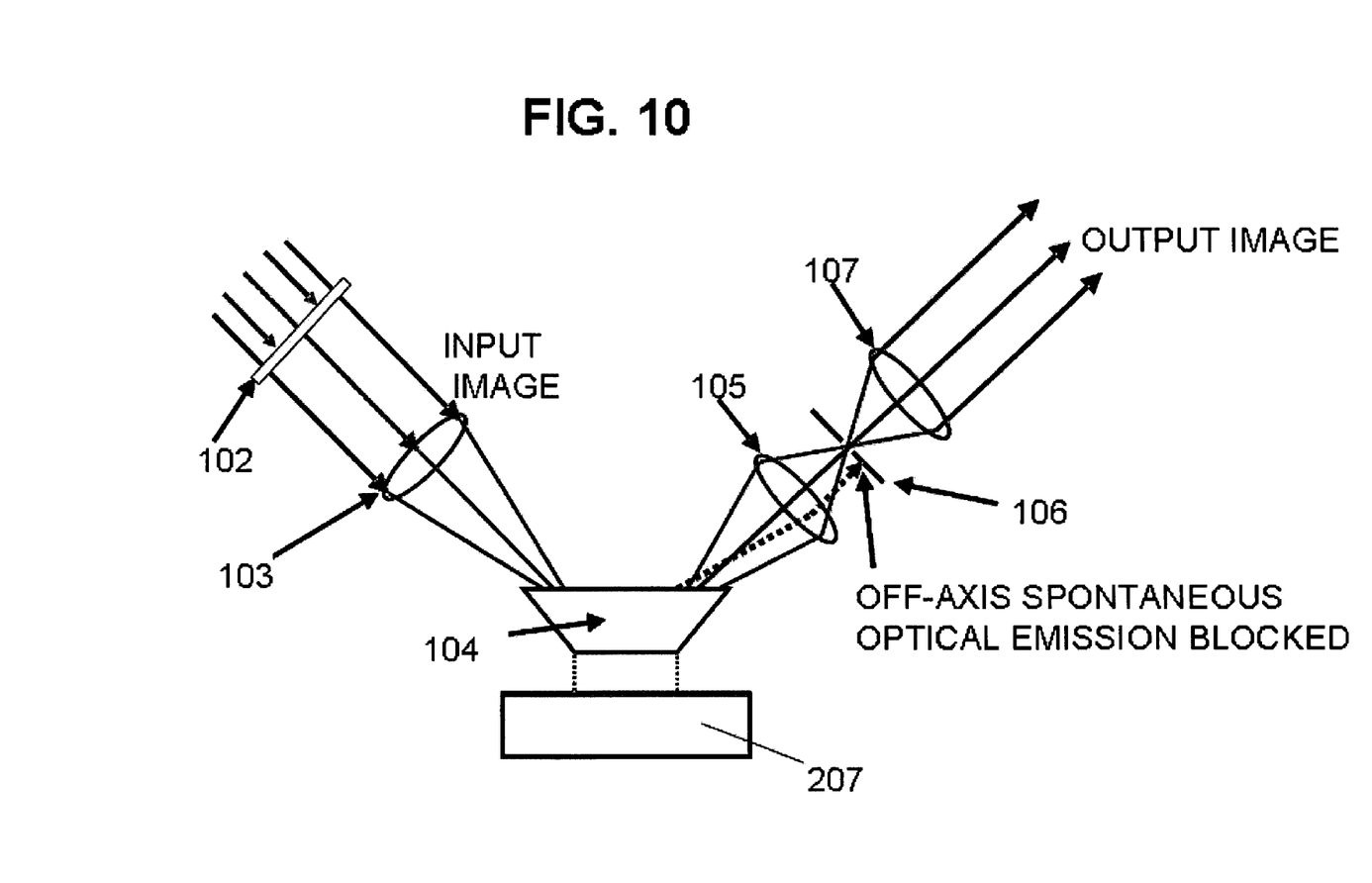
FIG. 10 is a perspective view of the optical switching system in accordance with the embodiment of FIG. 1 showing an off-axis optical path and blockage of spontaneous optical emission.

FIG. 10 is a perspective view of an exemplary optical system in accordance with the embodiment of FIG. 1. The system comprises a high pass filter 102 that receives the input image. The high pass filter 102 eliminates components present in the input image that fall below a particular frequency, resulting in a spectrally modified image. The spectrally modified input image passes through a focusing lens 103, which focuses the image into the semiconductor device 104, which is described further herein in conjunction with FIGS. 3 and 4. The semiconductor device 104 propagates the spectrally modified image to a focusing lens 105, if the semiconductor device 104 is active, e.g., power is applied to the semiconductor device 104. In addition to propagating the spectrally modified image, the semiconductor device 104 amplifies the spectrally modified image received via the focusing lens 103. The spectrally modified and amplified image is then focused onto a spatial filter 106 via a focusing lens 105. As the spectrally modified and amplified image passes to the focusing lens 105 from the semiconductor device 104, the image may contain spatial noise due to spontaneous emission from the semiconductor device 104. An optional spatial filter 106 may be utilized; preferably comprising one or more optical components (not shown), such as a lens and a pinhole, for removing the undesirable spatial noise from the image. The spatial filter may consist of, for example, a circular or rectangular plate with a hole in the center approximately 50 μm in diameter. The hole may be larger or smaller to maximize transmission and to eliminate off axis light rays. Thus, the optional spatial filter 106 is adapted to remove any undesirable optical noise resulting from the semiconductor device 104. The spatial filter 106 passes the light from the image to an optional collimating lens 107. Alternatively, the collimating lens could be replaced by a series of lenses and/or mirrors in a manner well known to those of ordinary skill in the art. The collimating lens 107 transforms the light into parallel beams of light which then proceed to the image sensor array (not shown). As an alternative, the image may be viewed by a human viewer, displayed on an opaque screen, storage medium, or any device suitable for image reception or transmission. The above disclosure may be in the form of a device that provides one color (blue) of a tristimulus device, where three wavelength bandpass intervals in the red, green and blue are chosen to closely coincide with the maximum sensitivity of the photopic response of the corresponding red, green and blue cones in the human eye (i.e., L-cones are sensitive primarily to the red portion of the visible spectrum, M-cones are sensitive to the green portion, and S-cones are sensitive to the blue portion. Accordingly, parallel usage of similar or corresponding devices in the red and green wavelength regions would provide a complete correspondence to the red, green and blue perceived by the cones of the human eye, thereby rendering the device(s) and images outputted therefrom suitable for human operator viewing with enhanced realism, yet providing active off-switching for protection from lasers, etc., as explained in the foregoing. Examples of semiconductor emission of light in the green spectrum are found in applicant's copending application Ser. No. 12/261,391, now U.S. Pat. No. 7,756,175, entitled PUMPED SEMICONDUCTOR LASER SYSTEMS AND METHODS, hereby incorporated by reference as though fully rewritten herein. Examples of semiconductor light emission in the red, green and blue spectrums are shown in U.S. Pat. No. 6,222,203, to Ishibashi, hereby incorporated by reference as though fully rewritten herein, wherein a self-luminous display device having distinct blue (B), green (G) and red (R) light emission sources is disclosed.

The present invention can be used as a single pass laser modulation device, provided sufficient population inversion exists in the active region. The use of a truncated inverted pyramid LED provides the capability of a subnanosecond response to an incoming laser threat and the use of an active limiting device in general provides the possibility of image amplification.

It should be emphasized that the above-described embodiments are merely possible examples, among others, of implementations. Many variations and modifications may be made to the above-described embodiments without departing from the scope of the disclosure. All such modifications and variations are intended to be included herein within the scope of the disclosure and protected by the following claims.

The invention claimed is:

1. An optical device comprising a semiconductor device, said semiconductor device comprising:

an input portion adapted to receive inputted light and an output portion adapted to output light;

an n-type region, a p-type region;

an active region sandwiched between the p-type and n-type regions wherein either the p-type or n-type region is adjacent one side of the active region and the other is adjacent the other side of the active region, the active region being substantially transparent to light of a predetermined wavelength range when a bias is applied across the n-type and p-type regions and substantially opaque to light within a predetermined wavelength range when a bias is not applied across the n-type and p-type regions.

2. The device of claim 1 wherein the optical device is adapted to be used when the user is exposed to a laser and wherein the optical device comprises a plurality of semiconductor devices arranged in tandem which are adapted to receive and transmit an image at a 90° angle of incidence when the semiconductor devices are biased and wherein the semiconductor devices provide the capability of a subnanosecond response to a laser threat when the biased is removed to substantially block the laser light.

3. The device of claim 1, wherein the semiconductor device operates to receive and transmit an image and wherein the semiconductor device further comprises first and second reflecting surfaces for reflecting the image, and first and second contacts for connecting to a power source for applying a bias across the n-type and p-type regions, said semiconductor device being mounted on a base portion for absorbing heat; whereby light of a predetermined wavelength range is absorbed by said unbiased active region upon multiple passes between the reflective surfaces and the image is transmitted to the output portion when a bias is applied.

4. The device of claim 1 wherein the semiconductor device is superluminescent and the active region comprises a multiple quantum well structure.

5. The device of claim 1, wherein the semiconductor device is a truncated inverted prism.

6. An optical device comprising a semiconductor device adapted to receive and transmit an image, said semiconductor device comprising:

an input portion adapted to receive inputted light and an output portion adapted to output light;

a cutoff filter positioned so as to substantially prevent light of a predetermined wavelength range from entering the input portion of the semiconductor device;

a first focusing means for focusing light from the light filter into the input portion of the semiconductor;

an n-type region, a p-type region;

an active region sandwiched between the p-type and n-type regions wherein either the p-type or n-type region is adjacent one side of the active region and the other is adjacent the other side of the active region, the active region being substantially transparent to light of a predetermined wavelength range when a bias is applied across the n-type and p-type regions and substantially opaque to light within a predetermined wavelength range when a bias is not applied across the n-type and p-type regions.

7. The device of claim 6, further comprising:

a spatial filter blocking off-axis spontaneous optical emission;

a second focusing means for focusing light from the output portion into the spatial filter;

an image sensor;

a third focusing means for focusing the image onto the image sensor;

whereby when a bias is applied across the n-type and p-type regions an image is transmitted from the input portion to the image sensor.

8. The device of claim 7, wherein the image sensor is operatively connected to at least one of the first or second contacts, and when light of a predetermined intensity is sensed by the image sensor, the bias applied to the n-type and p-type regions will be automatically discontinued.

9. The device of claim 7, wherein when then-type and p-type regions are not biased, the active region exhibits an extinction coefficient of approximately $10^6$ m$^{-1}$.

10. The device of claim 9, wherein the semiconductor comprises a Group III-V semiconductor compound in the active, n-type and p-type regions.

11. The device of claim 1 further comprising a plurality of semiconductor devices adapted to receive and transmit an image, the semiconductor devices operative to spectrally modify and propagate the image, and wherein the optical device is operative such that when the semiconductor devices are active the image is received by one of the plurality of semiconductor devices and the spectrally modified image propagates through each of the remaining semiconductor devices and the spectrally modified image is amplified as the spectrally modified image propagates.

12. The device of claim 1, further comprising second and third semiconductor devices adapted to receive and transmit an image, said first, second and third semiconductor devices operative to transmit light only in first, second and third predetermined wavelength ranges, said first semiconductor device operative to transmit light only in a first predetermined wavelength range in the blue portion of the visible spectrum to which the S-cones of the human eye are sensitive, said second semiconductor device operative to transmit light only in a second predetermined wavelength range in the red portion of the visible spectrum to which the L-cones of the human eye are sensitive, and said third semiconductor device operative to transmit light only in a third predetermined wavelength range in the green portion of the visible spectrum to which the M-cones of the human eye are sensitive, wherein each of the first, second and third predetermined wavelength ranges substantially coincide with the maximum sensitivity of the photopic response of the corresponding S (blue), L (red), and M (green) cones in the human eye.

13. The device of claim 2, further comprising a sensor array operable to receive the image, wherein the sensor array detects an image which is amplified and spectrally modified.

* * * * *